US009150981B2

United States Patent
Suzuki et al.

(10) Patent No.: US 9,150,981 B2
(45) Date of Patent: Oct. 6, 2015

(54) MANUFACTURING APPARATUS AND METHOD FOR SEMICONDUCTOR DEVICE

(75) Inventors: Kunihiko Suzuki, Shizuoka-ken (JP); Hideki Ito, Numazu (JP)

(73) Assignee: NuFlare Technology, Inc., Shizuoka-ken (JP)

(*) Notice: Subject to any disclaimer, the term of this patent is extended or adjusted under 35 U.S.C. 154(b) by 455 days.

(21) Appl. No.: 12/836,189

(22) Filed: Jul. 14, 2010

(65) Prior Publication Data
US 2011/0014789 A1    Jan. 20, 2011

(30) Foreign Application Priority Data
Jul. 15, 2009   (JP) .................................. 2009-166891

(51) Int. Cl.
| C23C 16/50 | (2006.01) |
| C23C 16/00 | (2006.01) |
| C23F 1/00 | (2006.01) |
| H01L 21/306 | (2006.01) |
| C30B 25/14 | (2006.01) |
| C23C 16/46 | (2006.01) |
| C23C 16/52 | (2006.01) |
| C30B 25/10 | (2006.01) |
| H01L 21/02 | (2006.01) |

(52) U.S. Cl.
CPC .................. *C30B 25/14* (2013.01); *C23C 16/46* (2013.01); *C23C 16/52* (2013.01); *C30B 25/10* (2013.01); *H01L 21/0262* (2013.01); *H01L 21/02532* (2013.01)

(58) Field of Classification Search
USPC .......................... 118/715, 728–733; 438/680; 156/345.51–345.55
See application file for complete search history.

(56) References Cited

U.S. PATENT DOCUMENTS

| 5,848,670 | A  | * | 12/1998 | Salzman ........................ 187/272 |
| 6,596,086 | B1 | * | 7/2003 | Honma et al. ................. 118/728 |
| 7,297,894 | B1 | * | 11/2007 | Tsukamoto et al. ...... 219/121.58 |
| 2002/0182892 | A1 |   | 12/2002 | Arai et al. |
| 2003/0045128 | A1 |   | 3/2003 | Tobashi et al. |
| 2003/0075109 | A1 | * | 4/2003 | Arai ............................... 118/728 |
| 2003/0194493 | A1 | * | 10/2003 | Chang et al. ................ 427/248.1 |
| 2005/0229855 | A1 | * | 10/2005 | Raaijmakers .................. 118/725 |
| 2006/0075972 | A1 | * | 4/2006 | Nakashima et al. ........... 118/729 |
| 2009/0142933 | A1 | * | 6/2009 | Yajima et al. .................. 438/758 |
| 2009/0272323 | A1 | * | 11/2009 | Ito ................................. 118/725 |

FOREIGN PATENT DOCUMENTS

| JP | 2002-43302 | 2/2002 |
| JP | 2009-71133 | 4/2009 |

* cited by examiner

*Primary Examiner* — Maureen Passey
*Assistant Examiner* — Tiffany Nuckols
(74) *Attorney, Agent, or Firm* — Finnegan, Henderson, Farabow, Garrett & Dunner, L.L.P.

(57) ABSTRACT

There is provided an apparatus for manufacturing a semiconductor device including a chamber in which a wafer is loaded; a gas supply mechanism for supplying process gas into the chamber; a gas discharge mechanism for discharging gas from the chamber; a heater having a slit and for heating the wafer to a predetermined temperature; a push-up base on which the wafer is mounted in an lifted state and housed in the slit in a lower state; a vertical rotation drive control mechanism for moving the push-up base up/down and rotating the push-up base in an lifted state; and a rotating member for rotating the wafer in a predetermined position and a rotation drive control mechanism connected to the rotating member.

8 Claims, 2 Drawing Sheets

MANUFACTURING APPARATUS AND METHOD FOR SEMICONDUCTOR DEVICE

CROSS-REFERENCE TO RELATED APPLICATION

This application is based upon and claims the benefit of priority from the prior Japanese Patent Application No. 2009-166891 filed on Jul. 15, 2009, the entire contents of which are incorporated herein by reference.

BACKGROUND OF THE INVENTION

The present invention relates to an apparatus and method for manufacturing a semiconductor device, for example, used for forming a film by supplying a reaction gas to the surface of a semiconductor wafer while heating the rear surface of the semiconductor wafer.

In recent years, as a semiconductor device is requested to realize lower price and higher performance, higher productivity in film forming process of a wafer and higher quality such as improvement in uniformity in film thickness is also required.

To satisfy such requirements, a back heating method is employed, which uses a single-wafer-processing epitaxial growth apparatus, supplies process gas while rotating a wafer at high speed of 900 rpm or higher in a chamber, and heats the wafer from the rear surface by using a heater.

Such a back heating method has a problem. When a wafer at room temperature is loaded into a chamber preliminarily heated to, for example, about 700° C. and transferred onto a member, a center member is cooled. Consequently, the temperature in a center portion in the wafer decreases, and temperature variation occurs. A method of excessively heating a center member is disclosed in Japanese Patent Application Laid-Open No. 2002-43302 ([0028] to [0029] and the like).

SUMMARY

An apparatus for manufacturing a semiconductor device as an aspect of the present invention includes: a chamber in which a wafer is loaded; a gas supply mechanism for supplying process gas into the chamber; a gas discharge mechanism for discharging gas from the chamber; a heater having a slit and for heating the wafer to a predetermined temperature; a push-up base on which the wafer is mounted in an lifted state and housed in the slit in a lower state; a vertical rotation drive control mechanism for moving the push-up base up/down and rotating the push-up base in an lifted state; and a rotating member for rotating the wafer in a predetermined position and a rotation drive control mechanism connected to the rotating member.

A method for manufacturing a semiconductor device as an aspect of the present invention includes: loading a wafer to be subjected to a film forming process into a chamber; preheating the wafer while rotating the wafer at predetermined rotational speed in a state where the wafer is apart from a rotating member that rotates the wafer in a predetermined position at the time of the film forming process; and forming a film on the wafer by heating the wafer at predetermined temperature in the predetermined position, rotating the wafer, and supplying process gas onto the wafer.

DETAILED DESCRIPTION

Reference will now be made in detail to the present embodiment of the invention, an example of which is illustrated in the accompanying drawings.

Conventionally, by heating a center portion, temperature variations in a wafer which occurs when a wafer at room temperature into a chamber of high temperature can be suppressed to a certain degree. In practice, it is, however, difficult to control to a state where the temperature variations in a wafer do not occur. Particularly, in the case where an oxide film is formed on the rear side of a wafer, the wafer is warped due to not only deadweight but also the temperature difference between the surface and the rear surface, variations in coefficients of thermal expansion, and the like.

By heating the wafer, the wafer is deformed from a concave state to a convex state. Consequently, a wafer jumping phenomenon occurs. Because of such a jumping phenomenon, the wafer is deviated from a normal position, cannot be held horizontally. Moreover, the wafer could be damaged by dropping, or the like. Therefore the yield and productivity deteriorate and, due to variations in film thickness, a problem occurs such that the reliability of a semiconductor device deteriorates.

By examination of the inventors of the present invention, it was found out that as the temperature difference between a center portion and a peripheral portion increases, the jumping phenomenon tends to occur. That is, after introducing a wafer into a chamber, when the temperature rises with the same change amount in the center and peripheral portions, a displacement amount can be suppressed. The following embodiments are carried out on the basis of such a finding.

Embodiments of the present invention will be described below with reference to the drawings.

First Embodiment

Figure 1:
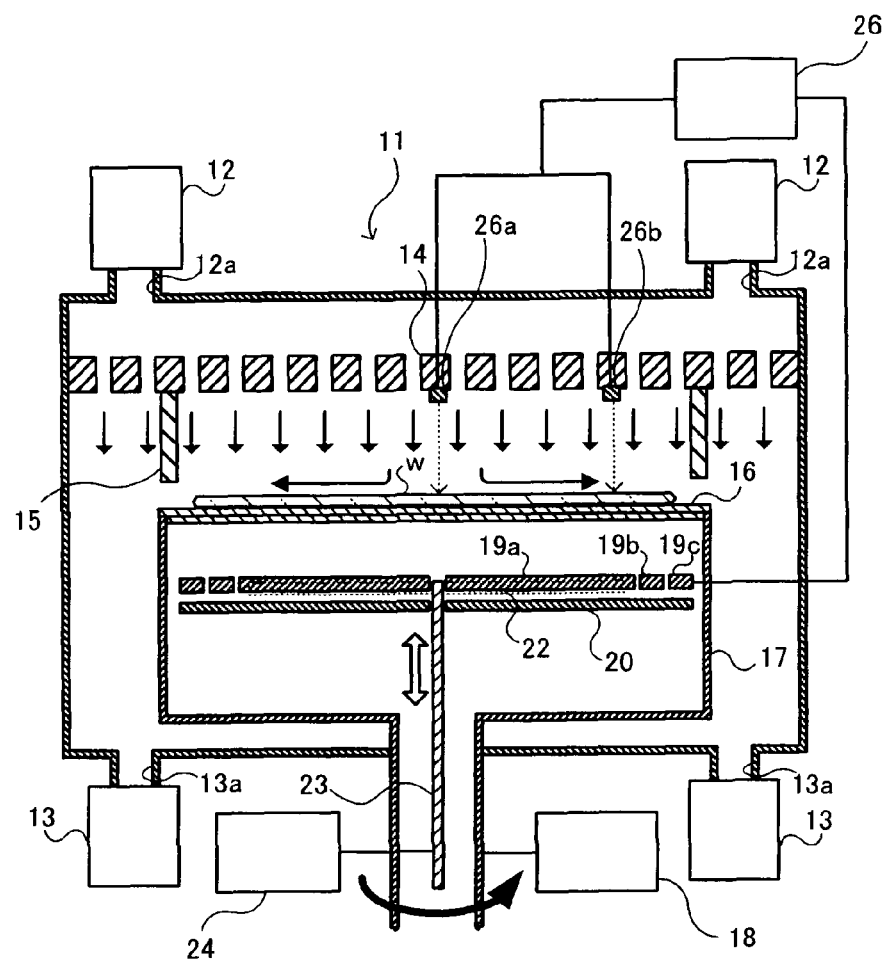
FIG. 1 is a diagram showing a section of an apparatus for manufacturing a semiconductor device as an aspect of the present invention.

FIG. 1 is a cross section of an epitaxial growth apparatus as an apparatus for manufacturing a semiconductor device of a first embodiment. As shown in FIG. 1, in a chamber 11 in which a wafer w having a diameter of, for example, 200 mm is subjected for film forming process, gas supply ports 12a connected to a gas supply mechanism 12 for supplying process gas containing a source gas such as trichlorosilane or dichlorosilane onto the wafer w at a predetermined flow rate from above the chamber 11 are provided. In a lower part of the chamber 11, gas discharge ports 13a connected to a gas discharge mechanism 13 for discharging gas to control the pressure in the chamber 11 to predetermined pressure (ordinary pressure) are provided in two places.

In an upper part of the chamber 11, a flow aligning plate 14 for supplying the process gas supplied from the gas support ports 12a in a flow aligned state onto the wafer w is provided. A liner 15 having a diameter of, for example, 240 mm is connected to the flow aligning plate 14 so as to surround an area above the wafer w.

In a lower part of the chamber 11, a susceptor 16 as a support member on which the wafer w is put is mounted on a ring 17 as a rotating member so that the distance between the wafer w and the flow aligning plate 14 becomes, for example, about 70 mm. The ring 17 is connected to a rotary drive control mechanism 18 constructed by a rotary shaft (not shown) for rotating the wafer w at predetermined rotational speed, a motor (not shown), and the like.

In the ring 17, a heater 19 constructed by an inner heater 19*a*, a middle heater 19*b*, and an outer heater 19*c* for heating the wafer w made of, for example, SiC is provided. Below the heaters, a disc-shaped reflector 20 for efficiently heating the wafer w is provided.

Figure 2:
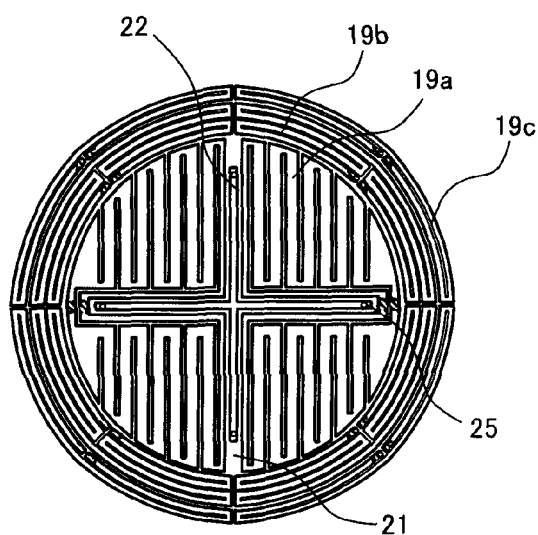
FIG. 2 is a top view of a heater in the aspect of the invention.

FIG. 2 is a top view of the heater 19. The middle heater 19*b* is provided in the periphery of the inner heater 19*a*, and the outer heater 19*c* is provided in the periphery of the middle heater 19*b*. A slit 21, such as a cross-shaped slit is formed in the inner heater 19*a*, and a similar-shaped (cross-shaped) push-up base 22 is housed in the slit 21.

Below the center of the push-up base 22, a push-up shaft 23 is provided so as to penetrate the center portion in the slit 21. The push-up shaft 23 is connected to a vertical rotation drive control mechanism 24 which includes a motor (not shown) for moving in vertical direction (up/down) and rotating. A pin 25 for supporting the wafer w via the susceptor 16 is provided at an end of a branch of the push-up base 22.

Further, a temperature sensing mechanism 26 having temperature sensors 26*a* and 26*b* for sensing a temperature distribution of the wafer w, that is, the temperature in a center portion and the temperature in a peripheral portion is provided, for example, under the flow aligning plate 14. The temperature sensing mechanism 26 is connected to the inner heater 19*a*, the middle heater 19*b*, and the outer heater 19*c*.

Using such an apparatus for manufacturing a semiconductor device an Si epitaxial film is formed on the wafer w having a diameter of, for example, 200 mm and on which a rear-face oxide film having a thickness of, for example, 900 nm is formed.

The gate (not shown) of the chamber 11 is opened and the wafer w is loaded by, for example, a robot hand into the chamber 11 whose inside is heated to, for example, 700° C. At this moment, the wafer w does not have variations in the temperature distribution and is slightly concave due to the difference between the thermal conductivity on the surface and that on the rear surface.

Figure 3:
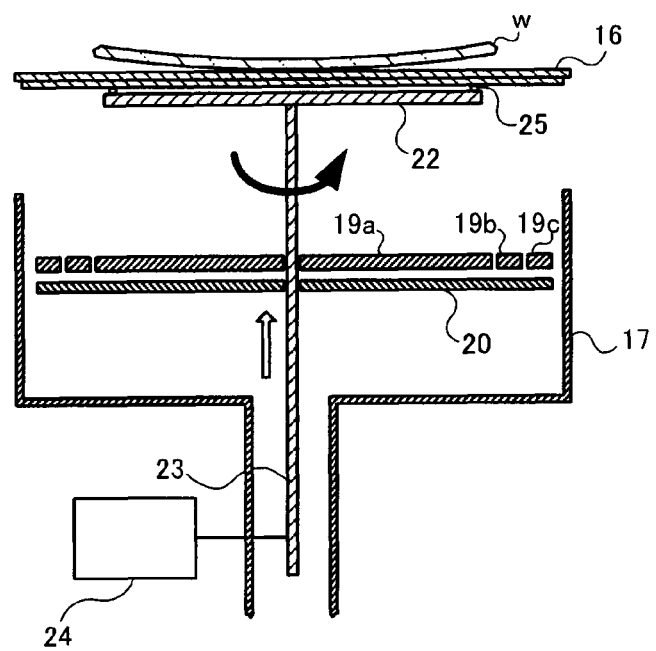
FIG. 3 is a diagram showing a semiconductor device manufacturing process in an aspect of the invention.

As shown in FIG. 3, by driving the push-up shaft 23 upward by the vertical rotation drive control mechanism 24, the push-up base 22 is raised. The wafer w is put on the susceptor 16 on the push-up base 22, and the gate (not shown) is closed. In this state, the wafer w is supported on the susceptor 16 on the push-up base 22 so that the height from the top face of the ring 17 becomes, for example, 60 mm.

While introducing a process gas which does not contain a film-forming source gas such as $H_2$ gas into the chamber 11 via the gas supply ports 12*a* by the gas supply mechanism 12, preheating is performed by controlling the inner heater 19*a*, the middle heater 19*b*, and the outer heater 19*c*. Simultaneously, by the vertical rotation control mechanism 24, the push-up base 22 is rotated at, for example, rotational speed of 300 rpm.

At the time point when the wafer w is loaded into the chamber 11, the temperature on the inner side (center portion) of the wafer w is lower than that on the outer side (peripheral portion). The temperature on the outer side is raised more than on the inner side by the preheating, the jumping phenomenon occurs. However, by performing the preheating while rotating the push-up base 22, rise in the temperature on the outer side is suppressed. Therefore, a large difference does not occur between the rate of temperature increase on the inner side and the outer side, and the jumping phenomenon of the wafer is suppressed.

As described above, by rotating the water w in the lifted state, the temperature on the outer side of the wafer w can be decreased. The reason is considered that by rotating the supporting member, the discharge rate of the process gas discharged between the liner 15 and the edge of the wafer w increases.

The preheating is performed in such a manner. In about 40 seconds since the start, the center temperature becomes about 750° C., the peripheral temperature becomes about 700° C., and the temperature becomes stable.

After the temperature becomes stable, by lowering the push-up base 22 and housing the push-up base 22 in the slit in lower state, the susceptor 16 on which the wafer w is put is mounted on the ring 17. The inner heater 19*a*, the middle heater 19*b*, and the outer heater 19*c* are controlled so that in-plane temperature of the wafer w detected by the temperature sensing mechanism 25 becomes uniformly 1100° C.

The wafer w is rotated at, for example, 900 rpm by the rotation drive control mechanism 18 and the process gas is supplied from the gas supply ports 12*a* via the flow aligning plate 14 in a flow aligned state onto the wafer w. The process gas is prepared so that, for example, trichlorosilane concentration becomes 2.5% and is supplied, for example, at 50 SLM.

On the other hand, the process gas containing trichlorosilane which becomes excessive, diluents gas, and a gas such as HCl as a reaction by-product are discharged downward from the space between the liner 15 and the susceptor 16. Further, those gases are discharged from the gas discharge ports 13*a* via the gas discharging mechanism 13, and the pressure in the chamber 11 is controlled to be constant (for example, ordinary pressure). In such a manner, the Si epitaxial film is grown on the wafer w.

As described above, by rotating the push-up base 22, the temperature rise on the outer side in the wafer w can be suppressed. By controlling the rotational speed, the rate of temperature rise on the outer side can be controlled. By controlling the rotational speed to control the rate of temperature rise, the jumping phenomenon in a state where the wafer w is supported on the push-up shaft 23 can be suppressed, and the push-up base 22 can be lowered in a state where the wafer w is mounted in a proper position.

Moreover since a heater such as the inner heater 19*a* is provided with an electrode, the temperature on the electrode which does not generate heat decreases, and temperature variations occur in the plane of the wafer w at the time of preheating. By rotating the push-up base 22 to change the relative position between the wafer w and the heather, the temperature variations can be suppressed.

Therefore, a film is formed uniformly on the wafer w and, while suppressing deterioration in the yield and productivity, the reliability of the semiconductor device can be improved.

In the first embodiment, the rotational speed of the push-up base is preferably 50 to 300 rpm. It is considered to be difficult to obtain the effect of the temperature control by rotation of the supporting member when the rotational speed is less than 50 rpm. On the other hand, when the rotational speed exceeds 300 rpm, at the time of stopping the rotation in order to put the wafer w on the supporting member, time required for the rotation stop extends one second per 20 revolutions so that the throughput deteriorates.

It is considered that the temperature or rate of temperature increase) on the outer side of the wafer w when the push-up base is rotated depends not only the rotational speed but also parameters such as the rate of discharge of the process gas discharged from the space between the liner and the edge of the wafer w, the distance between the flow aligning plate and the supporting member, and the support height of the wafer w. It is therefore considered that the rotational speed for obtaining desired temperature or rate of temperature increase fluctuates depending on the parameters.

Even when the rotational speed of the push-up base is less than 50 rpm, in the case of rotating the push-up base at 5 rpm or higher, the relative position to the electrode of the heater can be changed. Therefore, the uniformity of the in-plane temperature of the wafer w can be improved.

Second Embodiment

In a second embodiment, the configuration of the apparatus for manufacturing a semiconductor device is similar to that of the first embodiment. However, the second embodiment is different from the first embodiment with respect to the point that the ring as the rotating member is also rotated at the time of preheating.

Specifically, at the time of preheating, the push-up base 22 is rotated at, for example, 50 rpm by the vertical rotation drive control mechanism 24, and the ring 17 is rotated at, for example, 300 rpm in a direction opposite to the rotation direction of the push-up base 22 by the rotation drive control mechanism 18.

By such rotation, the rotational speed in an unstable state where the wafer w is lifted can be suppressed, and the temperature distribution and the temperature fluctuations of the wafer w at the time of preheating can be controlled at higher precision.

For example, by rotating the push-up base 22 at less than 50 rpm, the uniformity in the in-plane temperature of the wafer w is improved and, further, by rotating the ring 17, the temperature on the outer side of the wafer w can be controlled.

In a manner similar to the first embodiment, at the time of performing the film forming process on the wafer w, a film is formed uniformly on the wafer w and, while suppressing deterioration in the yield and productivity, the reliability of the semiconductor device can be improved.

Third Embodiment

In a third embodiment, the configuration of the apparatus for manufacturing a semiconductor device is similar to that of the first embodiment. However, the third embodiment is different from the first embodiment with respect to the point that the temperature sensing mechanism is connected to the vertical rotation drive control mechanism.

Figure 4:
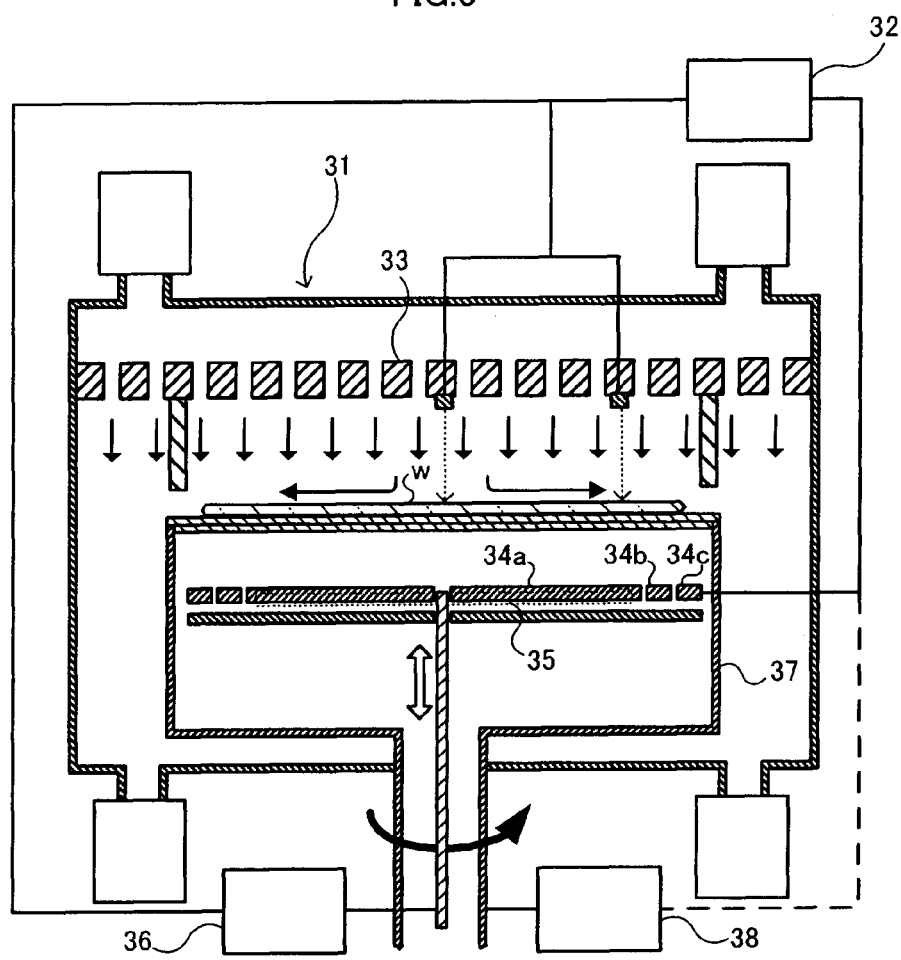
FIG. 4 is a diagram showing a section of an apparatus for manufacturing a semiconductor device as an aspect of the invention.

Specifically, as shown in FIG. 4, in a chamber 31, a temperature sensing mechanism 32 having temperature sensors for sensing the temperature distribution of the wafer w, that is, the temperature in a center portion and the temperature in a peripheral portion is provided, for example, under a flow aligning plate 33. The temperature sensing mechanism 32 is connected to an inner heater 34a, a middle heater 34b, and an outer heater 34c in a manner similar to the first embodiment. The temperature sensing mechanism 32 is also connected to a vertical rotation drive control mechanism 36 which moves a push-up base 35 in the vertical direction and rotates the push-up base 35 at predetermined rotational speed.

By the apparatus for manufacturing a semiconductor device, in a manner similar to the first embodiment, preheating is carried out. At this time, the rotational speed of the push-up base 35 can be controlled on the basis of the temperature distribution of the wafer w. The rotational speed of the push-up base 35 can be controlled on the basis of the temperature distribution of the wafer w. That is, the rotational speed of the push-up base 35 can be varied by the vertical rotation drive control mechanism 36 so that the difference between the temperature in a center portion and the temperature in a peripheral portion of the wafer w detected by the temperature sensing mechanism 32 becomes, for example, 50° C.

Further, the rotational speed of the push-up base 35 can be varied by the vertical rotation drive control mechanism 36 so that the temperature change amounts (a distribution of the temperature change amount) that is, rate of temperature increase between the center and peripheral portions of the wafer w become almost equal.

As described above, the rotational speed of the push-up base 35 is controlled on the basis of the temperature distribution of the wafer w or a distribution of the temperature change amounts (rate of temperature increase), and the rate of temperature increase in the peripheral portion of the wafer w can be controlled more properly. Therefore, in a manner similar to the first embodiment, the jumping phenomenon can be suppressed, and a film can be formed in a state where the wafer w is mounted in a proper position on the susceptor.

In addition, in a manner similar to the first embodiment, at the time of performing the film forming process on the wafer w, a film is formed uniformly on the wafer w and, while suppressing deterioration in the yield and productivity, the reliability of the semiconductor device can be improved.

In the third embodiment, the ring may be also rotated at the time of preheating just as the second embodiment. In this case, to perform temperature control at higher precision, preferably, as shown by a broken line in FIG. 4, the temperature control mechanism 32 is connected to a rotation drive control mechanism 38 that controls rotation of a ring 37.

Although the wafer w is mounted on the push-up base via the susceptor at the time of conveyance and preheating in the foregoing embodiments, the wafer w may be mounted directly on the push-up shaft 20. In this case, it is sufficient to provide a ring-shaped holder as a supporting member on the ring and put the wafer w on the holder.

The susceptor may be divided into a susceptor in the center portion and a susceptor in the peripheral portion. Only the susceptor in the center portion is lifted by the push-up base and, at the time of making the push-up base descend after preheating, is disposed on the inner side of the susceptor in the peripheral portion.

Considering high-temperature stability, like the heater or the like, at least the surface of the push-up base is preferably made of SiC or the like. To stably hold the wafer w, in a sectional shape in the vertical direction (shorter-side direction) of the push-up base (branch portion), preferably, length "b" in the vertical direction is greater than length "a" in the horizontal direction and, more preferably, a/b is equal to 5 to 15.

Although the push-up base has a cross shape, that is has four branch portions connected to the push-up shaft, the invention is not limited to the example. It is sufficient that the number of the branch portions is three or more.

According to the present embodiment, a film such as an epitaxial film can be formed on a semiconductor wafer with high productivity. In addition, the yields of wafers and semiconductor devices manufactured through an element formation process and an element separation process can be improved and stable element characteristics of the semiconductor devices can be obtained. In particular, by applying to an epitaxial formation process of power semiconductor devices such as power MOSFET and IGBT, which require growth of a thick film having a thickness of 100 μm or more in an N-type base region, P-type base region or an insulation isolation region, satisfactory element characteristics can be obtained.

While the epitaxial film is formed on an Si substrate in this embodiment, it can be applied to forming of a polysilicon layer and it can be applied also to other compound semiconductors, for example, a GaAs layer, a GaAlAs layer, and an InGaAs layer. It can also be applied to forming of an $SiO_2$ film and an $Si_3N_4$ film, and in the case of $SiO_2$ film, monosilane ($SiH_4$) and gases of $N_2$, $O_2$, and Ar are fed, and in the case of $Si_3N_4$ film, monosilane ($SiH_4$) and gases of $NH_3$, $N_2$, $O_2$, and Ar are fed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for manufacturing a semiconductor, comprising:
    a chamber configured to load a wafer into the chamber;
    a gas supply mechanism configured to supply process gas into the chamber;
    a gas discharge mechanism configured to discharge gas from the chamber;
    a supporting member configured to support the wafer;
    a rotating member configured to support an outer portion of the supporting member and to rotate the wafer supported by the supporting member;
    a heater provided in an inner space of the rotating member and spaced from the supporting member, the heater having a slit and the heater configured to control a temperature of the heater to heat the wafer to a predetermined temperature;
    a push-up base configured to mount the wafer in a lifted state and the push-up base configured to be housed in the slit in a lower state;
    a vertical rotation drive control mechanism configured to move the push up base in a vertical direction between the lifted state and the lower state, and to rotate the wafer by rotating horizontally the push-up base in the lifted state when the wafer mounted on the push-up base is preheated by the heater; and
    a rotation drive control mechanism connected to the rotating member and configured to control a rotating speed of the rotating member so as to be separated from a rotating control of the push-up base.

2. The apparatus for manufacturing a semiconductor device according to claim 1, further comprising a temperature sensing mechanism configured to measure temperature in a center portion and temperature in a peripheral portion in the wafer.

3. The apparatus for manufacturing a semiconductor device according to claim 2, wherein the temperature sensing mechanism is connected to the vertical rotation drive control mechanism.

4. The apparatus for manufacturing a semiconductor device according to claim 1, wherein the heater includes an outer heater provided below the peripheral portion in the wafer.

5. The apparatus for manufacturing a semiconductor device according to claim 1, wherein the slit has a cross shape.

6. The apparatus for manufacturing a semiconductor device according to claim 1, wherein at least the surface of the push-up base is made of SiC.

7. The apparatus for manufacturing a semiconductor device according to claim 1, wherein a top-face shape of the push-up base is a cross shape.

8. The apparatus for manufacturing a semiconductor device according to claim 1, wherein length in the vertical direction is greater than length in the horizontal direction in a sectional shape in the vertical direction of a branch portion of the push-up base.

* * * * *